US012640522B2

(12) United States Patent
Lim et al.

(10) Patent No.:  US 12,640,522 B2
(45) Date of Patent:     May 26, 2026

(54) SHIELDED BOARD TO BOARD ELECTRICAL CONNECTOR WITH SURROUNDING SHIELDING AND ELECTICAL DEVICE USING THE SAME

(71) Applicant: Samsung Electronics Co., Ltd., Suwon-si (KR)

(72) Inventors: Juyoung Lim, Suwon-si (KR); Hyunwook Noh, Suwon-si (KR); Yongjae Song, Suwon-si (KR); Inha Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 437 days.

(21) Appl. No.: 18/295,467

(22) Filed: Apr. 4, 2023

(65) Prior Publication Data

US 2023/0246395 A1      Aug. 3, 2023

Related U.S. Application Data

(63) Continuation of application No. PCT/KR2021/013026, filed on Sep. 24, 2021.

(30) Foreign Application Priority Data

Oct. 7, 2020     (KR) ........................ 10-2020-0129351

(51) Int. Cl.
H01R 13/6582      (2011.01)
H01R 12/71      (2011.01)
(Continued)

(52) U.S. Cl.
CPC ....... H01R 13/6582 (2013.01); H01R 12/714 (2013.01); H01R 12/716 (2013.01);
(Continued)

(58) Field of Classification Search
CPC .............. H01R 13/6582; H01R 12/714; H01R 12/716; H01R 12/79; H01R 13/6585;
(Continued)

(56) References Cited

U.S. PATENT DOCUMENTS 6,558,195 B1     5/2003  Kusuhara
9,888,562 B2     2/2018  Malek et al.
(Continued)

FOREIGN PATENT DOCUMENTS

JP          2018-190600 A      11/2018
KR          10-0858656 B1        9/2008
(Continued)

OTHER PUBLICATIONS

International Search Report dated Jan. 7, 2022; International Appln. No. PCT/KR2021/013026.

(Continued)

*Primary Examiner* — Justin M Kratt
(74) *Attorney, Agent, or Firm* — Jefferson IP Law, LLP

(57) ABSTRACT

An electronic device is provided. The electronic device includes a housing, a first substrate arranged in an inner space of the housing and including at least one electrical element, at least one receptacle including a plurality of conductive terminals arranged to at least partially surround the at least one electrical element included in the first substrate, and at least one connector detachably coupled to the at least one receptacle and including a plurality of connector terminals, wherein at least one of the plurality of conductive terminals may be electrically connected to the ground of the first substrate.

19 Claims, 15 Drawing Sheets

(51) Int. Cl.

| | |
|---|---|
| *H01R 12/79* | (2011.01) |
| *H01R 13/6585* | (2011.01) |
| *H01R 13/6597* | (2011.01) |
| *H05K 9/00* | (2006.01) |
| *H01R 13/6581* | (2011.01) |
| *H01R 13/6594* | (2011.01) |
| *H01R 24/38* | (2011.01) |

(52) U.S. Cl.
CPC ......... *H01R 12/79* (2013.01); *H01R 13/6585* (2013.01); *H01R 13/6597* (2013.01); *H05K 9/0018* (2013.01); *H01R 12/71* (2013.01); *H01R 12/712* (2013.01); *H01R 13/6581* (2013.01); *H01R 13/6594* (2013.01); *H01R 24/38* (2013.01); *H01R 2201/00* (2013.01); *H01R 2201/16* (2013.01); *H05K 9/0007* (2013.01); *H05K 9/002* (2013.01); *H05K 9/0022* (2013.01); *H05K 9/0024* (2013.01); *H05K 9/0026* (2013.01)

(58) Field of Classification Search
CPC .. H01R 12/71; H01R 12/712; H01R 13/6581; H01R 13/6594; H01R 13/6597; H01R 24/38; H01R 2201/00; H01R 2201/16; H05K 9/0018; H05K 9/0007; H05K 9/002; H05K 9/0022; H05K 9/0024; H05K 9/0026
See application file for complete search history.

(56) References Cited

U.S. PATENT DOCUMENTS

| | | | |
|---|---|---|---|
| 10,566,742 | B2 | 2/2020 | Kodama |
| 10,601,182 | B2 | 3/2020 | Horino et al. |
| 2009/0081893 | A1 | 3/2009 | Bae |
| 2010/0033940 | A1 | 2/2010 | Yamaguchi et al. |
| 2010/0304584 | A1 | 12/2010 | Miyazaki et al. |
| 2015/0222044 | A1 | 8/2015 | Arai et al. |
| 2016/0238651 | A1* | 8/2016 | An ........................ G01R 31/66 |
| 2018/0069332 | A1 | 3/2018 | Yoshioka |
| 2019/0305487 | A1 | 10/2019 | Ozeki |
| 2019/0319381 | A1 | 10/2019 | Bang et al. |
| 2020/0220306 | A1 | 7/2020 | Kodama |

FOREIGN PATENT DOCUMENTS

| | | | | |
|---|---|---|---|---|
| KR | 10-2010-0127732 | A | 12/2010 | |
| KR | 10-2016-0089216 | A | 7/2016 | |
| KR | 10-2016-0101603 | A | 8/2016 | |
| KR | 10-2019-0119819 | A | 10/2019 | |
| KR | 10-2019-0139653 | A | 12/2019 | |
| WO | WO-2019235877 | A1* | 12/2019 | .............. H05K 9/00 |

OTHER PUBLICATIONS

Korean Office Action with English translation dated Nov. 29, 2024; Korean Appln. No. 10-2020-0129351.

\* cited by examiner

SHIELDED BOARD TO BOARD ELECTRICAL CONNECTOR WITH SURROUNDING SHIELDING AND ELECTICAL DEVICE USING THE SAME

CROSS-REFERENCE TO RELATED APPLICATION(S)

This application is a continuation application, claiming priority under § 365(c), of an International application No. PCT/KR2021/013026, filed on Sep. 24, 2021, which is based on and claims the benefit of a Korean patent application number 10-2020-0129351, filed on Oct. 7, 2020, in the Korean Intellectual Property Office, the disclosure of which is incorporated by reference herein in its entirety.

BACKGROUND

1. Field

The disclosure relates to an electronic device that includes a shielding connector structure.

2. Description of Related Art

Electronic devices are being gradually slimmed and are being developed to increase rigidity of the electronic devices, to enhance a design aspect, and to differentiate functional elements thereof.

Multiple electronic components disposed in an internal space of an electronic device have to be arranged in a space-efficient manner with respect to each other in order to help slim the electronic device. In addition, even if multiple electronic components are arranged in a space-efficient manner in the internal space of an electronic device, the quality the electronic device may be deteriorated if the functions of the components are not properly implemented. Therefore, it is a trend that electronic devices are being developed to satisfy these arrangement conditions.

The above information is presented as background information only to assist with an understanding of the disclosure. No determination has been made, and no assertion is made, as to whether any of the above might be applicable as prior art with regard to the disclosure.

SUMMARY

An electronic device may include one or more electronic components disposed in the inner space thereof. The one or more electronic components may be electrically connected to each other to execute a corresponding function of the electronic device. These electronic components may include at least two substrates (e.g., printed circuit boards) disposed in the inner space of the electronic device. Each substrate may be arranged in a stacked manner to secure an efficient mounting space and may be electrically connected to each other via an interposer (e.g., a stacked substrate) disposed therebetween. For example, each substrate may include multiple conductive terminals (e.g., conductive pads), and the two substrates are electrically connectable to each other when the multiple conductive terminals are brought into physical contact with multiple corresponding conductive terminals (e.g., corresponding conductive pads) arranged on the corresponding surfaces of the interposer.

However, since the interposer is coupled to the two substrates via a bonding process such as soldering, it is difficult to maintain the electronic device. In addition, since the interposer is bonded to be electrically connected to the entire areas of the two substrates, shielding of individual electrical elements may be limited. Furthermore, since the interposer is relatively limited in the number of connection terminals, it is necessary to increase the size of the interposer in order to increase the number of connection terminals, which may go against the slimming of the electronic device.

Aspects of the disclosure are to address at least the above-mentioned problems and/or disadvantages and to provide at least the advantages described below. Accordingly, an aspect of the disclosure is to provide an electronic device including a shielding connector structure.

Another aspect of the disclosure is to provide an electronic device including a shielding connector structure that may be easily detachable during maintenance.

Another aspect of the disclosure is to provide an electronic device including a shielding connector structure that is capable of helping slim down the electronic device while increasing the number of connection terminals.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a first substrate disposed in an inner space of the housing and including at least one electrical element, at least one receptacle disposed on the first substrate to at least partially surround the at least one electrical element, wherein the at least one receptacle includes at least one receptacle base including a recess, wherein the at least one receptacle base includes a first sidewall disposed adjacent to the at least one electrical element through the recess, a second side wall spaced outward from the first side wall through the recess, and an island area protruding in the recess along a longitudinal direction, wherein the recess includes a first recess disposed between the island area and the first side wall and a second recess disposed between the island area and the second side wall, first multiple conductive terminals arranged at a predetermined interval from at least a portion of the first side wall to at least a portion of the first recess, second multiple conductive terminals arranged at a predetermined interval from at least a portion of the island area to at least a portion of the first recess, third multiple conductive terminals arranged at a predetermined interval from at least a portion of the second side wall to at least a portion of the second recess, and fourth multiple conductive terminals arranged at a predetermined interval from at least a portion of the island area to at least a portion of the second recess, and at least one connector detachably coupled to the at least one receptacle, wherein the at least one connector includes at least one connector base including an island seating portion on which the island area is seated, a third side wall disposed to face the first recess, and a fourth side wall disposed to face the second recess, first multiple connector terminals arranged on at least a portion of the third side wall and elastically coupled to the first multiple conductive terminals, second multiple connector terminals arranged on at least a portion of the third side wall and elastically coupled to the second multiple conductive terminals, third multiple connector terminals arranged on at least a portion of the fourth side wall and elastically coupled to the third multiple conductive terminals, and fourth multiple connector terminals arranged on at least a portion of the fourth side wall and elastically coupled to the fourth multiple conductive terminals. At least one multiple conductive terminal from among the first, the second, the third, and the fourth multiple conductive terminals is electrically connected to a ground of the first substrate.

Various embodiments of the disclosure electrically connect two substrates and provide a shielding connector structure including a receptacle and a connector disposed between the two substrates, thereby helping efficiently shield electrical elements disposed on the substrates. In addition, the various embodiments are advantageous for maintenance and are capable of helping slim down an electronic device while increasing the number of connection terminals.

In addition, various effects directly or indirectly identified through the disclosure may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
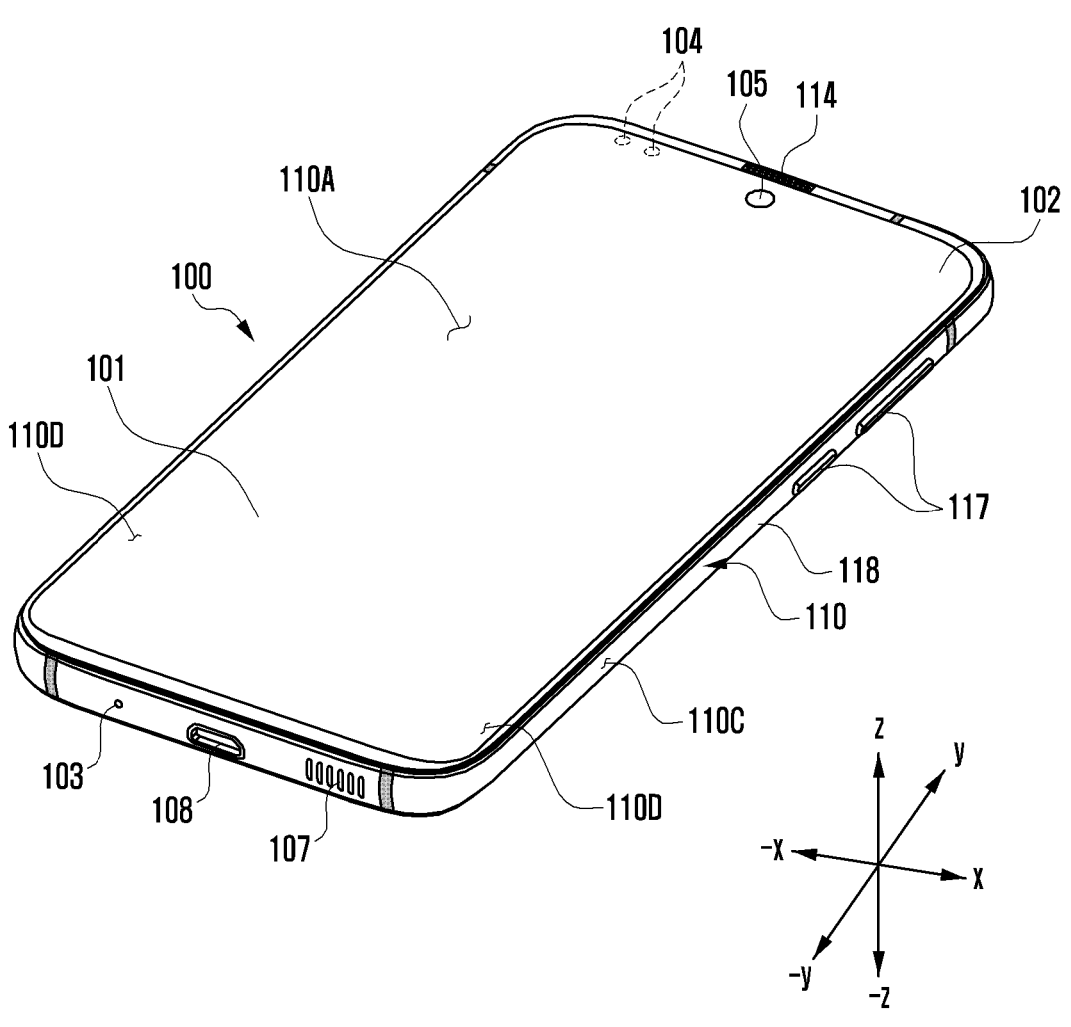
FIG. 1 is a front perspective view of an electronic device (e.g., a mobile electronic device) according to an embodiment of the disclosure.
Figure 2:
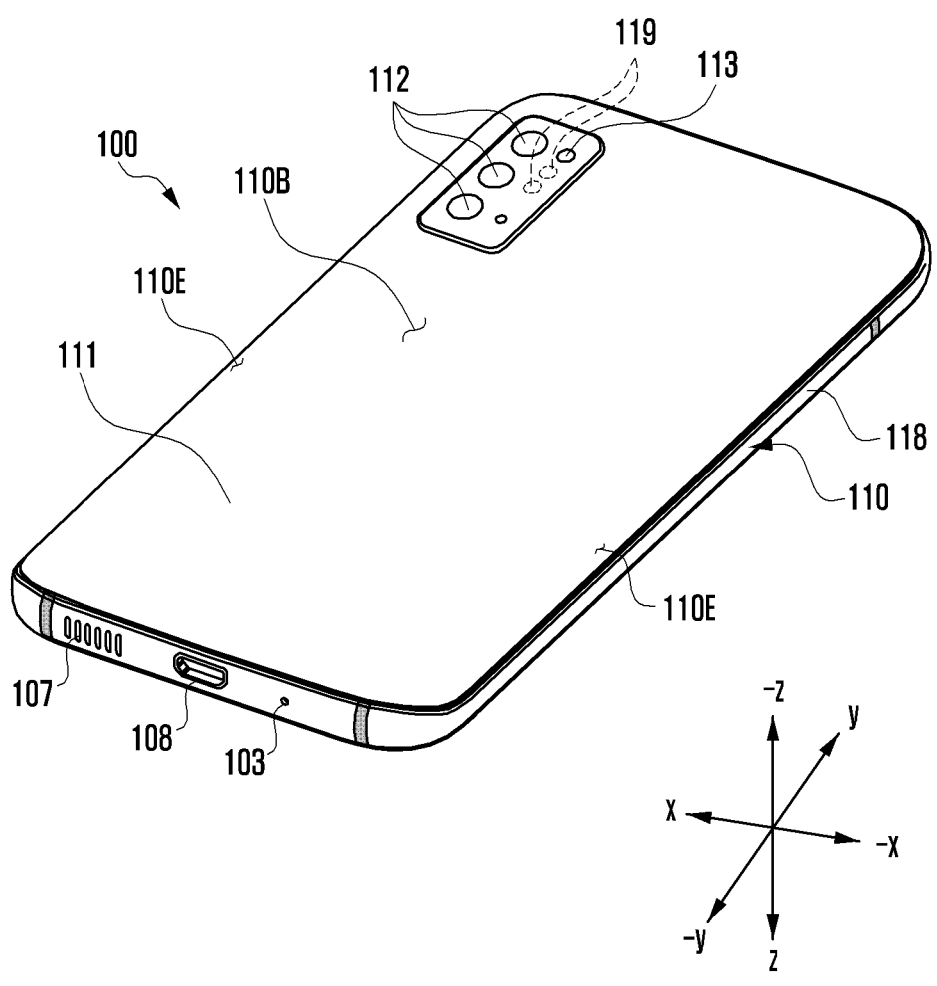
FIG. 2 is a rear perspective view of the electronic device of FIG. 1 according to an embodiment of the disclosure.

FIG. 1 illustrates a perspective view showing a front surface of a mobile electronic device according to an embodiment of the disclosure, and FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector hole 108. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector hole 108 may include a first connector hole 108 adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules 105 of camera modules 105 and 112, some sensor modules 104 of sensor modules 104 and 119, or an indicator may be arranged to be exposed through a display 201. For example, the camera module 105, the sensor module 104, or the indicator may be arranged in the internal space of an electronic device 100 so as to be brought into contact with an external environment through an opening of the display 101, which is perforated up to a front plate 102. According to an embodiment, an area corresponding to some camera module 105 of the display 201 is a part of an area in which content is displayed, and may be formed as a transmission area having designated transmittance. For example, the transmission area may be formed to have transmittance having a range of about 5% to about 20%. For example, a transmission area of the display 101 may include an area in which the density of pixels and/or a wiring density are lower than that of surroundings. The camera module 105 may include, for example, under display camera (UDC). In another embodiment, some sensor modules 204 may be arranged to perform their functions without being visually exposed through the front plate 102 in the internal space of the electronic device. For example, in this case, an area of the display 101 facing the sensor module may not require a perforated opening.

According to various embodiments, an electronic device 100 has a bar-type or plate-type appearance, but the disclosure is not limited thereto. For example, the illustrated electronic device 100 may be a part of a foldable electronic device, a slidable electronic device, a stretchable electronic device, and/or a rollable electronic device. The "foldable electronic device", the "slidable electronic device", the "stretchable electronic device", and/or the "rollable electronic device" may be an electronic device in which, since the display (e.g., the display 330 in FIG. 3) is bendable, the display is capable of being at least partially folded, wound or rolled, at least partially expanded in area, and/or received inside a housing (e.g., the housing 110 in FIGS. 1 and 2). In the case of the foldable electronic device, the slidable electronic device, the stretchable electronic device, and/or the rollable electronic device, a user may use a screen display area in an expanded state by unfolding the display or exposing a greater area of the display to the exterior if necessary.

Figure 6A:
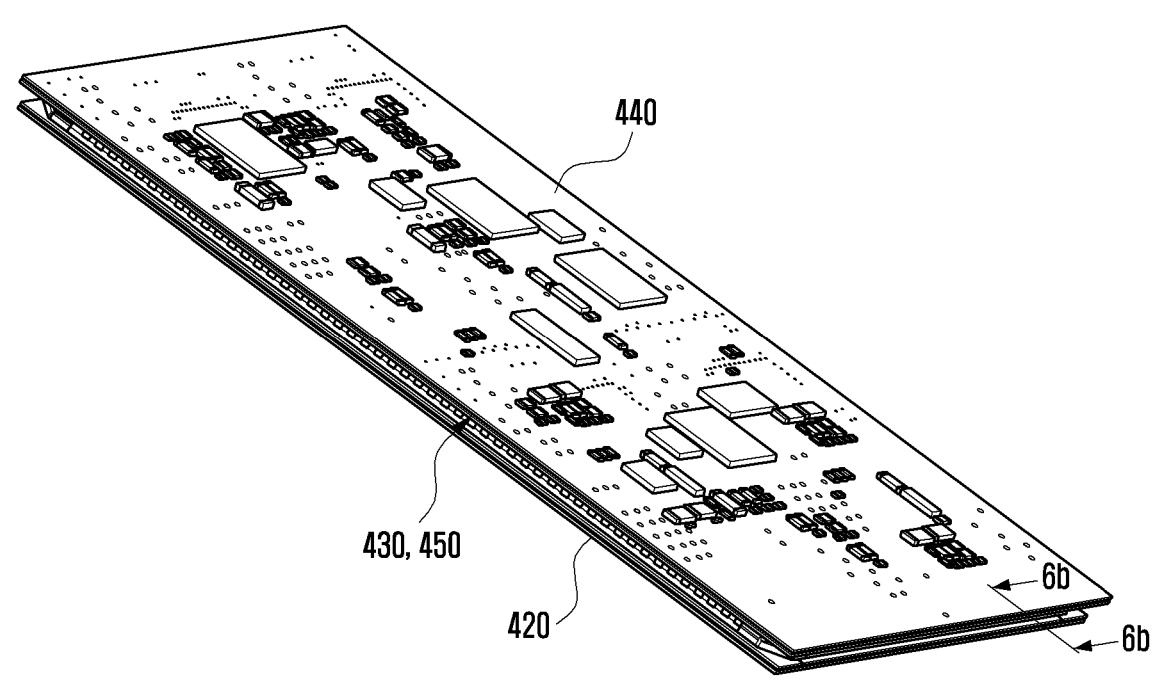
FIG. 6A is a perspective view illustrating a state in which the first substrate and the second substrate are coupled according to an embodiment of the disclosure.
Figure 6B:
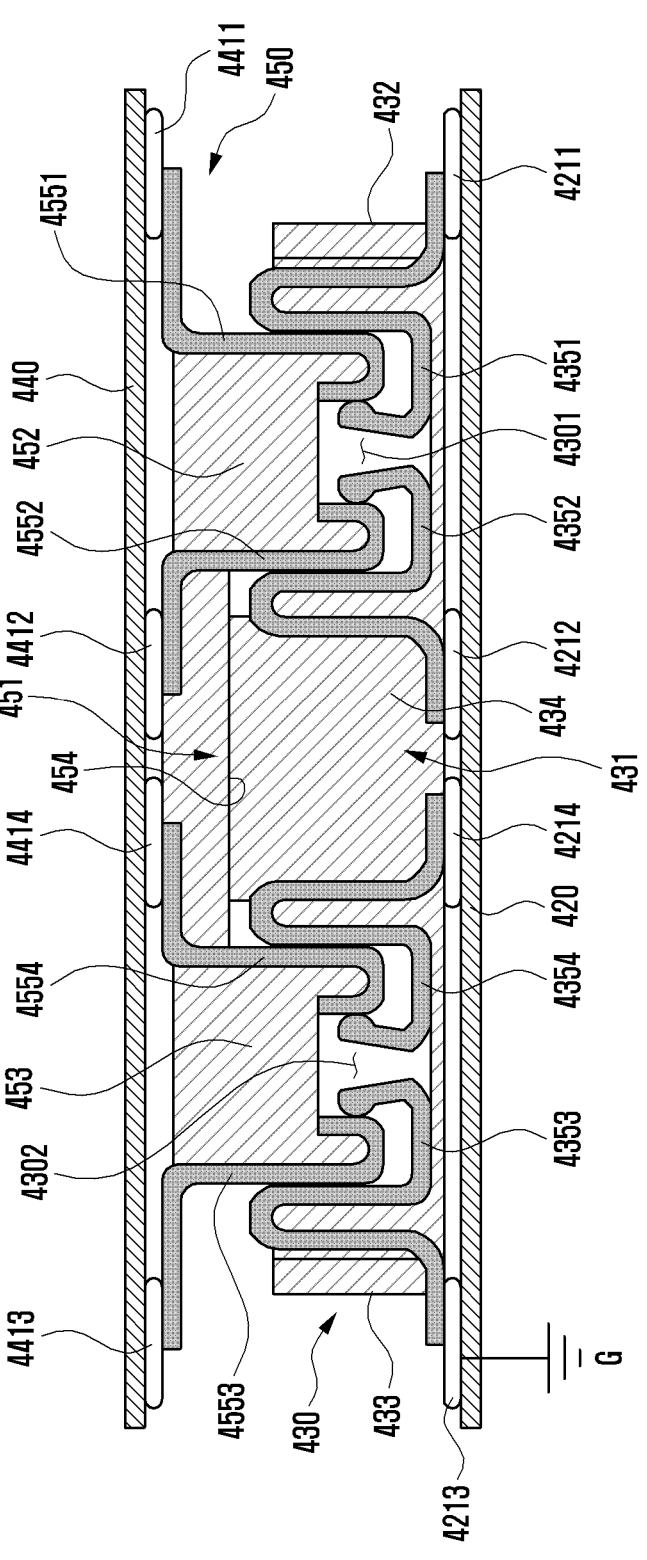
FIG. 6B is a partial cross-sectional view illustrating a coupling relationship between a receptacle and a connector taken along line 6*b*-6*b* according to an embodiment of the disclosure.

According to various embodiments, two substrates (e.g., the first substrate 420 and the second substrate 440 of FIG. 6B) are electrically connected according to various embodiments of the disclosure, and a connection structure of a receptacle (e.g., the receptacle 430 of FIG. 6B) and the connector (e.g., the connector 450 of FIG. 6B) providing a shielding structure may be applied to at least one of the bar-type electronic device, the plate-type electronic device, the foldable electronic device, the slidable electronic device, the stretchable electronic device, or the rollable electronic device described above.

Figure 3:
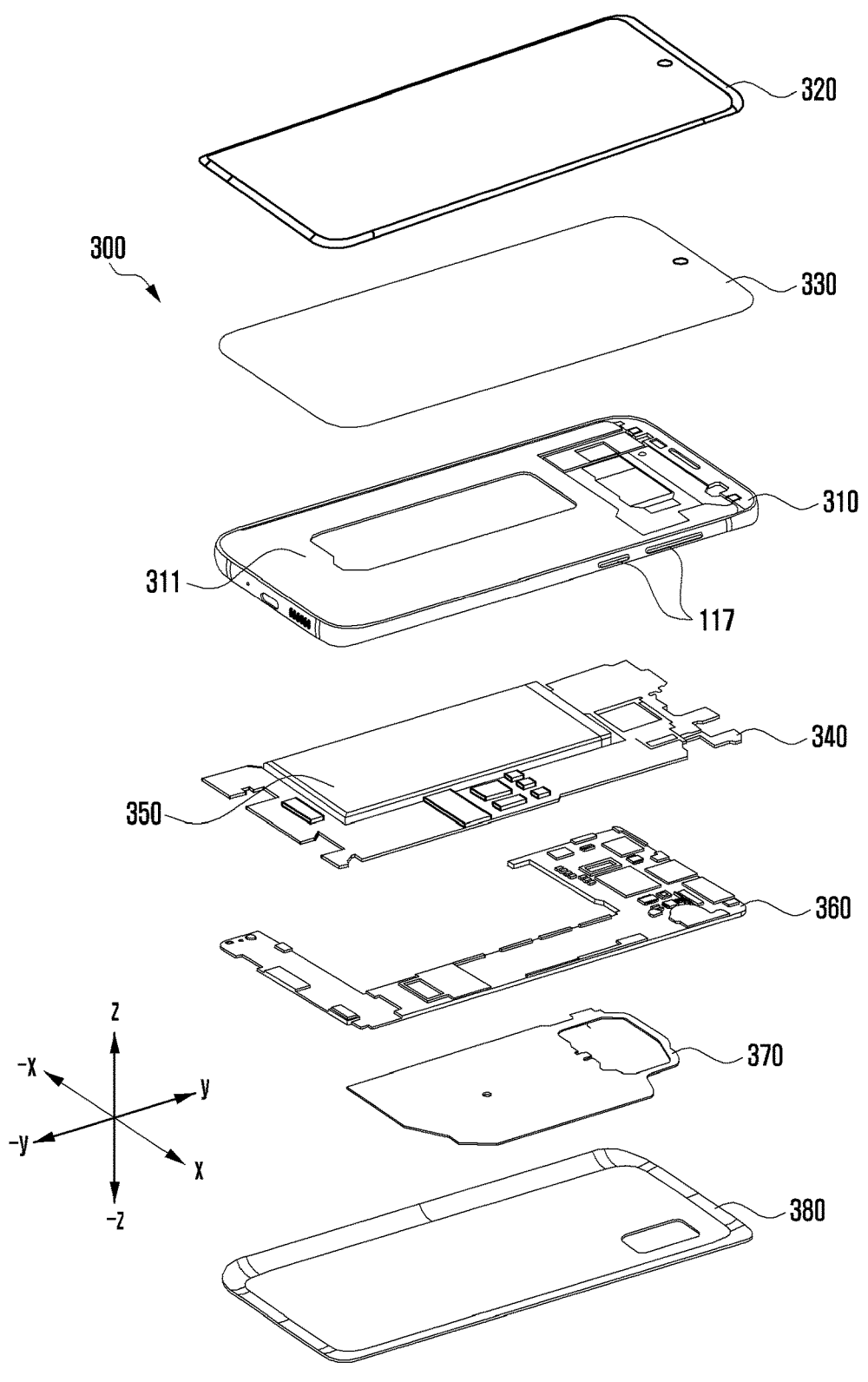
FIG. 3 is an exploded perspective view of the electronic device of FIG. 1 according to an embodiment of the disclosure.

FIG. 3 illustrates an exploded perspective view showing a mobile electronic device shown in FIG. 1 according to an embodiment of the disclosure.

The electronic device 300 in FIG. 3 may be at least partially similar to the electronic device 100 in FIGS. 1 and 2 or may further include other embodiments.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
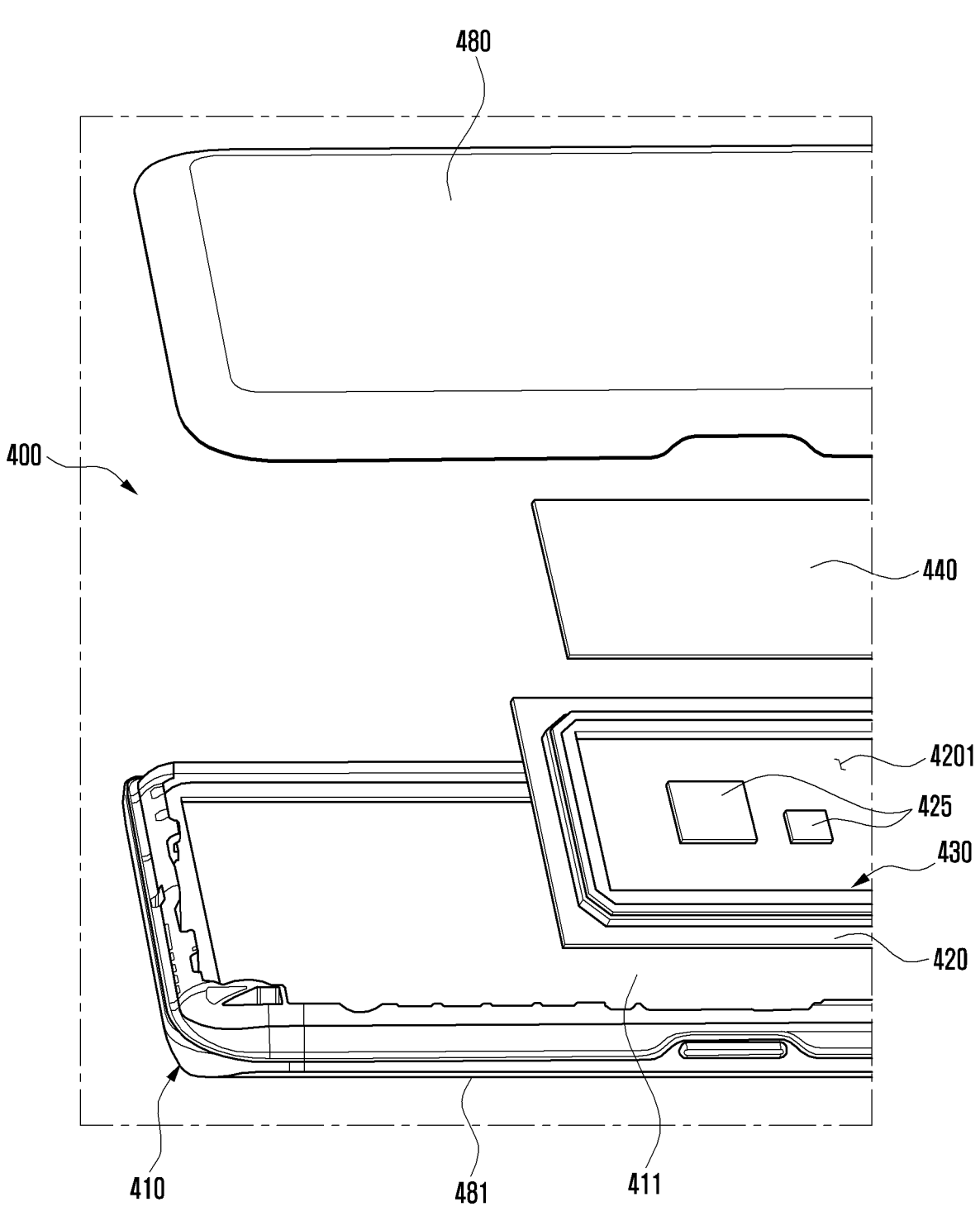
FIG. 4 is an exploded perspective view of an electronic device in which a shielding connector structure is disposed according to an embodiment of the disclosure.

FIG. 4 is an exploded perspective view of an electronic device in which a shielding connector structure is disposed according to an embodiment of the disclosure.

The electronic device 400 of FIG. 4 may be at least partially similar to the electronic device 100 in FIGS. 1 and 2 or the electronic device 300 of FIG. 3 or may include other embodiments of the electronic device.

Referring to FIG. 4, the electronic device 400 (e.g., the electronic device 300 in FIG. 3) may include a housing (e.g., the housing 110 in FIG. 1) including a front surface cover 481 (e.g., the front plate 320 in FIG. 3), a rear surface cover 480 (e.g., the rear plate 380 in FIG. 3) facing away from the front surface cover 481, and a side surface member 410 (e.g., the lateral bezel structure 310 in FIG. 3) surrounding the space between the front surface cover 481 and the rear surface cover 480. According to an embodiment, the electronic device 400 may include a first support member 411 (e.g., the first support member 311 in FIG. 3) disposed in the inner space thereof. According to an embodiment, the first support member 411 may be disposed to extend into the inner space from the side surface member 410. As another example, the first support member 411 may be separately provided in the inner space of the electronic device 400. According to an embodiment, the first support member 411 may extend from the side surface member 410 and may be at least partially made of a conductive material.

According to various embodiments, the electronic device 400 may include a pair of substrates 420 and 440 (e.g., substrates) disposed between the first support member 411 and the rear surface cover 480 in the inner space thereof. According to an embodiment, the pair of substrates 420 and 440 may be disposed such that at least some areas overlap when the front surface cover 481 is viewed from above (e.g., in the Z-axis direction in FIG. 3). According to an embodiment, the pair of substrates 420 and 440 may include a first substrate 420 (e.g., a main substrate or a first substrate) disposed between the first support member 411 and the rear surface cover 480, and a second substrate 440 (e.g., a sub-substrate) disposed between the first substrate 420 and the rear surface cover 480. For example, the first substrate 420 as the main substrate may be larger than the second substrate 440 as the sub-substrate when the front surface cover 481 is viewed from above. In some embodiments, the first substrate 420 may have substantially the same size as the second substrate 440 when the front surface cover 481 is viewed from above. In some embodiments, the first substrate 420 may be smaller than the second substrate 440 when the front surface cover 481 is viewed from above.

According to various embodiments, the first substrate 420 may include a receptacle 430 disposed on a surface facing the second substrate 440. According to an embodiment, the second substrate 440 may include a connector (e.g., the connector 450 in FIG. 5B) disposed on the surface facing the first substrate 420 and electrically connected to the receptacle 430 when the first substrate 420 and the second substrate 440 are coupled. Accordingly, the first substrate 420 and the second substrate 440 may be electrically connected to each other via the coupling structure of the connector 450 coupled to the receptacle 430.

According to various embodiments, the electronic device 400 may include a shielding structure (e.g., a shielding connector structure) through the coupling of the receptacle 430 and the connector 450 that electrically interconnects the two substrates 420 and 440. For example, at least one electrical element 425 (e.g., active elements, passive elements, and/or integrated circuit chips) disposed on the first substrate 420 may be at least partially surrounded by the first space 4201 defined by the receptacle 430, may be disposed on the second substrate 440, and may be shielded through connection of a connector (e.g., the connector 450 of FIG. 5B) having substantially the same shape as the receptacle 430. According to an embodiment, the first space 4201 may be defined in a closed loop shape or a partially open loop shape by the receptacle 430.

According to various embodiments, the electronic device 400 may include a second support member (not illustrated) (e.g., a fixing bracket) disposed between the second substrate 440 and the rear surface cover 480. According to an embodiment, the second support member (not illustrated) may be disposed at a position at which the second support member (not illustrated) at least partially overlaps the second substrate 440. According to an embodiment, the second support member may include a metal plate. According to an embodiment, the first substrate 420, the shielding structure (e.g., the shielding connector structure), and the second substrate 440 may be fixed to the electronic device 400 via the second support member (not illustrated). As another embodiment, the first substrate 420, the shielding structure (e.g., the shielding connector structure), and the second substrate 440 may be disposed in the inner space of the electronic device 400 without the second support member (not illustrated).

Figure 5A:
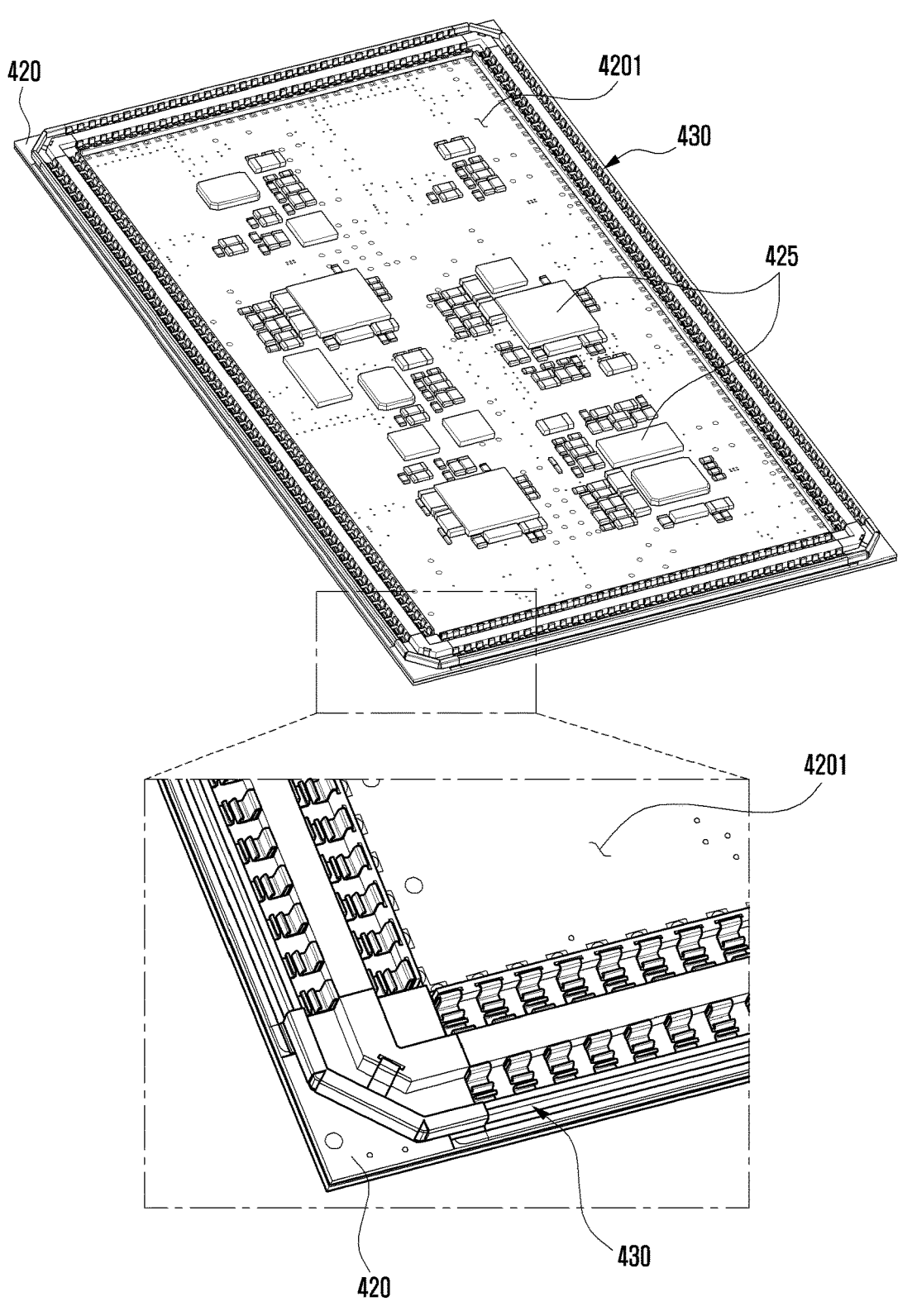
FIG. 5A is a perspective view of a first substrate including a receptacle according to an embodiment of the disclosure.
Figure 5B:
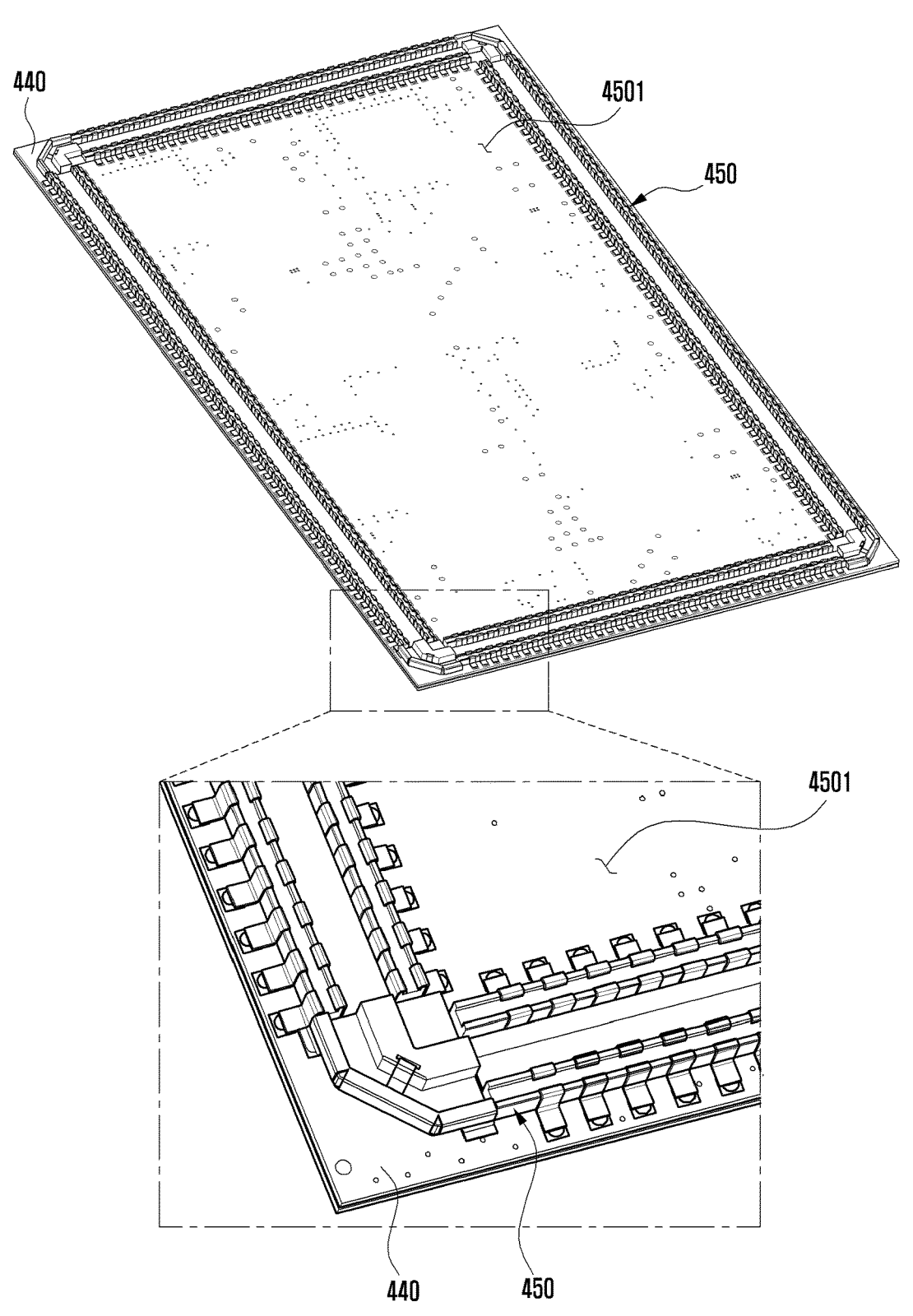
FIG. 5B is a perspective view of a second substrate including a connector coupled to the receptacle of FIG. 5A according to an embodiment of the disclosure.

FIG. 5A is a perspective view of the first substrate including a receptacle according to an embodiment of the disclosure. FIG. 5B is a perspective view of a second substrate including a connector coupled to the receptacle of FIG. 5A according to an embodiment of the disclosure.

Referring to FIGS. 5A and 5B, the first substrate 420 may include a receptacle 430 disposed to define a first space 4201 in the manner of surrounding at least one electrical element 425. According to an embodiment, the receptacle 430 may be electrically connected to at least one electrical element 425 disposed on the first substrate 420. According to an embodiment, the receptacle 430 may include multiple conductive terminals, and some of the multiple conductive terminals may be electrically connected to the ground of the first substrate 420.

According to various embodiments, the second substrate 440 may include a connector 450 having a corresponding shape to be connected to the receptacle 430. According to an embodiment, the second substrate 440 may include a second space 4501 defined to face the first space 4201 via the connector 450. According to an embodiment, the connector 450 may include multiple connector terminals, and some of the multiple connector terminals may be electrically connected to the ground of the second substrate 440.

According to various embodiments, the ground of the first substrate 420 and/or the ground of the second substrate 440 may include a ground conductor, a ground plane, or a ground layer.

According to various embodiments, when the second substrate 440 is coupled to the first substrate 420, the receptacle 430 and the connector 450 are capable of maintaining the first space 4201 and the second space 4501 in a sealed state, thereby shielding at least one electrical element 425 disposed therein as well. In some embodiments, the at least one electrical element 425 may be disposed within the second space 4501 of the second substrate 440. In some embodiments, the at least one electrical element 425 may be disposed in both the first space 4201 and the second space 4501.

FIG. 6A is a perspective view illustrating the state in which the first substrate and the second substrate are coupled according to an embodiment of the disclosure. FIG. 6B is a partial cross-sectional view illustrating a coupling relationship between the receptacle and the connector taken along line 6b-6b according to an embodiment of the disclosure.

Referring to FIGS. 6A and 6B, the first substrate 420 and the second substrate 440 may be electrically connected through the connection of the receptacle 430 and the connector 450. According to an embodiment, when the first substrate 420 and the second substrate 440 are coupled, the at least one electrical device (e.g., the electrical device 425 of FIG. 5A) disposed on the first substrate 420 may be electrically shielded from the surroundings.

According to various embodiments, the receptacle 430 disposed on the first substrate 420 may include a receptacle base 431 and conductive terminals 4351, 4352, 4353, and 4354 disposed on the receptacle base 431. According to an embodiment, the receptacle base 431 may be made of a polymer material mold. For example, the receptacle base 431 is a type of molding product, and may support the conductive terminals 4351, 4352, 4353, and 4354 while including an insulating material. According to various embodiments, the receptacle base 431 may suppress deformation of the conductive terminals 4351, 4352, 4353, and 4354 and may provide a binding structure with the connector 450. The conductive terminals 4351, 4352, 4353, and 4354 may be assembled to or mounted on the receptacle base 431 by a press fit method or mounted on the receptacle base 431 simultaneously when the receptacle base 431 is molded through an insert injection molding process. According to various embodiments, the receptacle base 431 may include structures for supporting first multiple conductive terminals 4351 and second multiple conductive terminals 4352, respectively, and structures for third multiple conductive terminals 4353 and fourth multiple conductive terminals 4354, respectively.

According to an embodiment, the receptacle base 431 may include recesses 4301 and 4302. According to an embodiment, the receptacle base 431 may include a first side wall 432 disposed adjacent to the at least one electrical element (e.g., the electrical elements 425 of FIG. 5A) through the recesses 4301 and 4302, a second side wall 433 spaced outward from the first side wall 432 through the recesses 4301 and 4302, and an island area 434 protruding in the recesses 4301 and 4302 along the longitudinal direction of the receptacle base 431. According to an embodiment, the recesses 4301 and 4302 may include a first recess 4301 provided between the island area 434 and the first side wall 432 and a second recess 4302 provided between the island area 434 and the second side wall 433. According to an embodiment, the multiple conductive terminals 4351, 4352, 4353, and 4354 may include first multiple conductive terminals 4351 arranged at a predetermined interval from at least a portion of the first side wall 432 to at least a portion of the first recess 4301, second multiple conductive terminals 4352 arranged at a predetermined interval from at least a portion of the island area 434 to at least a portion of the first recess 4301, third multiple conductive terminals 4353 arranged at a predetermined interval from at least a portion of the second side wall 433 to at least a portion of the second recess 4302, and fourth multiple conductive terminals 4354 arranged at a predetermined interval from at least a portion of the island area 434 to at least a portion of the second recess 4302. According to an embodiment, the multiple conductive terminals 4351, 4352, 4353, and 4354 may be electrically connected to the conductive pads 4211, 4212, 4213, and 4214 disposed at corresponding positions of the first substrate through a bonding process such as soldering. According to an embodiment, the third multiple conductive terminals 4353 disposed farthest from the at least one electrical element (e.g., the electrical element 425 of FIG. 5A) may be electrically connected to the ground G of the first substrate 420.

According to various embodiments, the multiple conductive terminals 4351, 4352, 4353, and 4354 are fabricated by bending a conductive plate, wherein one end portion of each conductive terminal may be connected to one of the conductive pads 4211, 4212, 4213, and 4214 of the first substrate 420, and the other end portion (e.g., a first binding portion) may be bent substantially in an alphabet U shape. Between the opposite ends of the second multiple conductive terminals 4352 and the fourth multiple conductive terminals 4354 may be disposed while at least partially surrounding the island area 434 or being surrounded by the island area 434.

According to various embodiments, the connector 450 disposed on the second substrate 440 may include a connector base 451 and connector terminals 4551, 4552, 4553, and 4554 coupled to the connector base 451. According to an embodiment, the connector base 451 may include an island seating portion 454 on which the island area 434 of the receptacle base 431 is seated, a third side wall 452 disposed to face the first recess 4301 of the receptacle base 431, and a fourth side wall 453 disposed to face the second recess 4302 of the receptacle base 431. According to an embodiment, the connector terminals 4551, 4552, 4553, and 4554 may include first multiple connector terminals 4551 disposed on at least a portion of the third side wall 452 and elastically coupled to the first multiple conductive terminals 4351, second multiple connector terminals 4552 disposed on at least a portion of the third side wall 452 and elastically coupled to the second multiple conductive terminals 4352, third multiple connector terminals 4553 disposed on at least a portion of the fourth side wall 453 and elastically coupled to the third multiple conductive terminals 4353, and fourth multiple connector terminals 4554 disposed on at least on a portion of the fourth side wall 453 and elastically coupled to the fourth multiple conductive terminals 4354. According to an embodiment, the multiple connector terminals 4551, 4552, 4553, and 4554 may be electrically connected to the conductive pads 4411, 4412, 4413, and 4414 disposed at corresponding positions of the second substrate 440 through a bonding process such as soldering.

According to various embodiments, the multiple connector terminals 4551, 4552, 4553, and 4554 are fabricated by bending a conductive plate, wherein one end portion of each connector terminal may be connected to one of the conductive pads 4411, 4412, 4413, and 4414 of the second substrate 440, and the other end portion (e.g., a second binding portion) may be bent substantially in an alphabet U shape.

According to various embodiments, when the receptacle 430 and the connector 450 are coupled, the second binding portion of each of the multiple connector terminals 4551, 4552, 4553, and 4554 may be coupled in a state of being wrapped by the first binding portion of each of the multiple conductive terminals 4351, 4352, 4353, and 4354. For example, the first binding portion may press the second binding portion while partially accommodating the second binding portion. As a result, the multiple connector terminals 4551, 4552, 4553, and 4554 and the multiple conductive terminals 4351, 4352, 4353, and 4354 may come into contact with each other at two different points or two different areas.

According to various embodiments (not illustrated), the shapes of the first binding portion and the second binding portion are not limited to the illustrated example and may have various shapes. For example, the portion of the second binding portion that comes into contact with the first binding portion may be thicker than a portion that does not come into contact with the first binding portion. For example, the second binding portion may have a match head shape rather than the alphabet U shape, and the first binding portion may be configured in an engagement step shape corresponding to the match head shape, so that the mechanical binding force between the receptacle 430 and the connector 450 can be further improved.

According to various embodiments (not illustrated), the second binding portion may come into contact with one surface of the first binding portion and also come into contact with an end of the first binding portion. For example, the second binding portion may further include an elastic piece protruding from one surface. The elastic piece is substantially a portion of the second binding portion or a portion of one surface of the second binding portion and may come into direct contact with the first binding portion. In another embodiment, an end portion of the first binding portion may be rolled into a shape close to a circle or a polygon to stably come into contact with the end portion of the second binding portion. For example, the end shapes of the elastic piece and the end portion of the first bind portion are capable of stably maintaining the electrical connection state between the first coupling portion and the second coupling portion.

According to various embodiments (not illustrated), the second binding portion is capable of coming into contact with one surface of the first binding portion and coming into contact with the end portion of the first binding portion, and at least a portion of the second binding portion (e.g., a portion to come into contact with the first binding portion (hereinafter, referred to as a "head") may be thicker than the other portion. For example, when the head of the second binding portion has a thicker structure than the other portion, since an engagement step is provided in the first binding portion, it is possible to further improve the mechanical binding force between the receptacle 430 and the connector 450.

According to various embodiments, since two conductive terminals of the receptacle 430 are disposed in one recess 4301 or 4302 in the receptacle base 431, a relatively large number of conductive terminals compared to the minimized volume of the receptacle base 431 may be used as signal lines and/or ground lines.

In another embodiment, the receptacle 430 may further include a fifth conductive terminal (not illustrated) on at least a portion of the island area 434 of the receptacle base 431. For example, the fifth conductive terminal (not illustrated) may be electrically connected to a ground conductor of the first substrate 420 or a ground conductor of the second substrate 440.

The shielding structure (e.g., a receptacle and a connector) according to various embodiments is not limited to the illustrated embodiments and may be configured in various shapes. For example, the numbers, arrangements, locations, or roles (e.g., the receptacle or the connector) of the conductive terminals 4351, 4352, 4353, and 4354 and the connector terminals 4551, 4552, 4553, and 4554, which constitute the receptacle 430 and the connector 450, may be changed. For example, the arrangement of the conductive terminals 4351, 4352, 4353, and 4354 of the receptacle 430 and/or the connector terminals 4551, 4552, 4553, and 4554 of the connector 450 may be constituted with four or more separate terminals. For example, the arrangement may be configured in a symmetrical 4-column*n-row arrangement or an asymmetric 5-column*n-row arrangement.

Figure 7A:
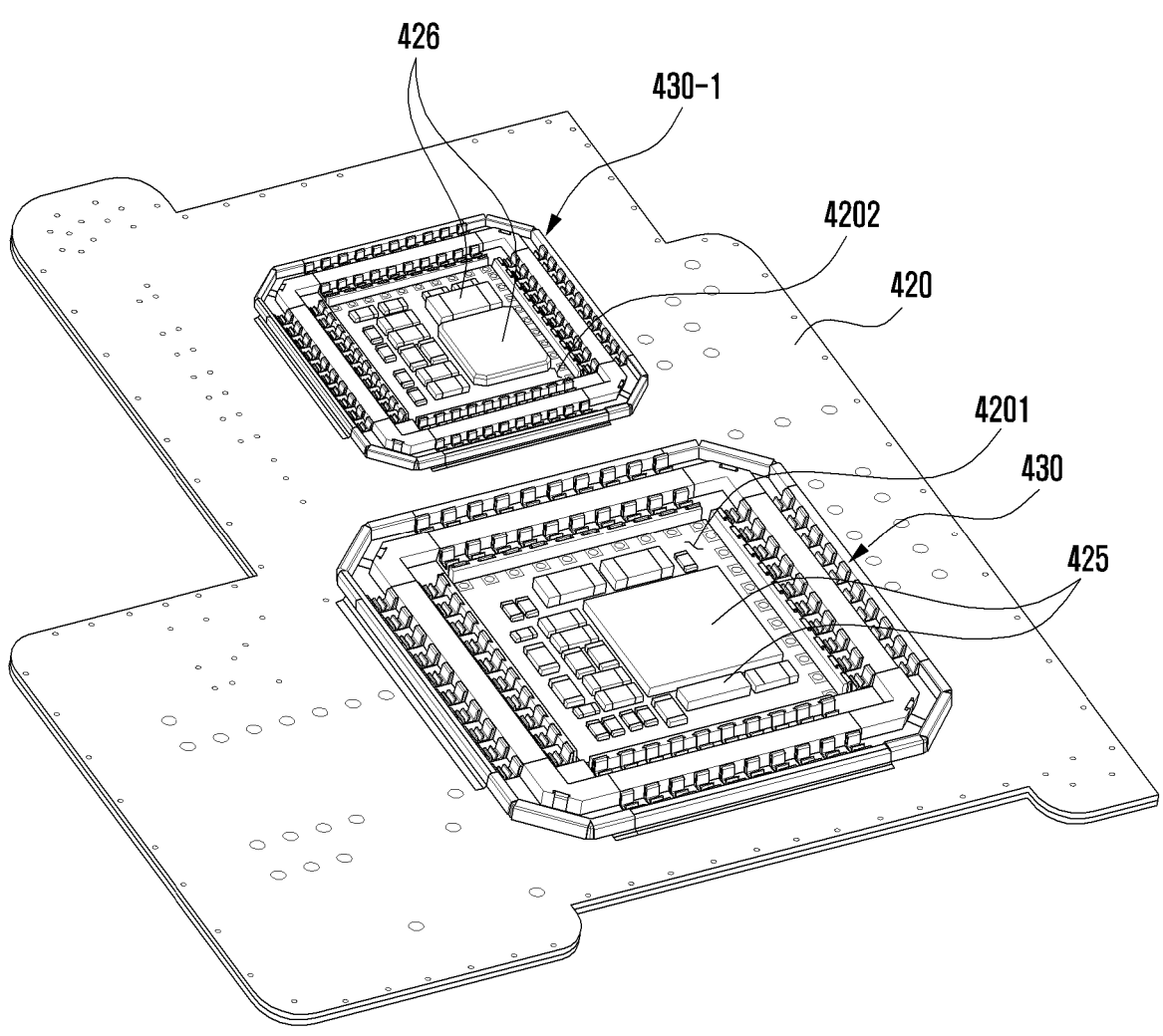
FIG. 7A is a perspective view of a first substrate including receptacles according to an embodiment of the disclosure.
Figure 7B:
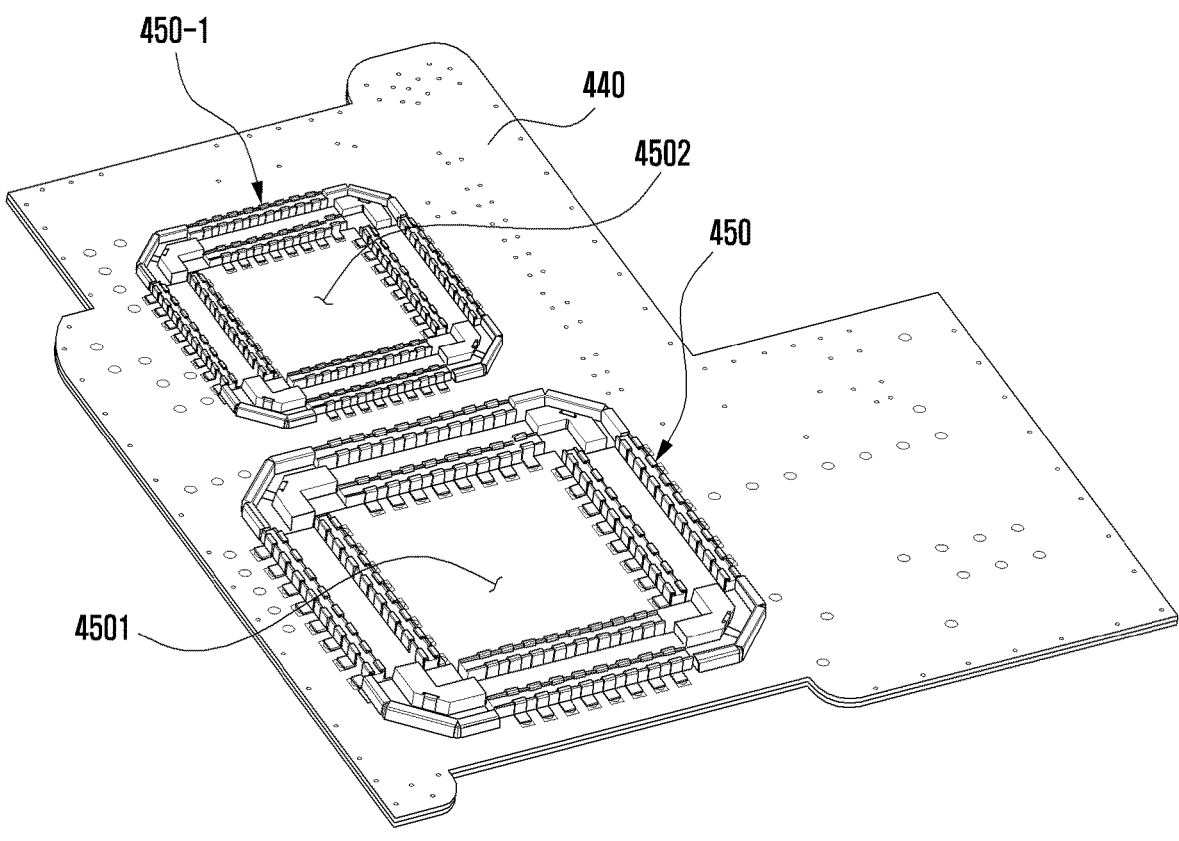
FIG. 7B is a perspective view of a second substrate including connectors coupled to the receptacles of FIG. 7A according to an embodiment of the disclosure.

FIG. 7A is a perspective view of a first substrate including receptacles according to an embodiment of the disclosure. FIG. 7B is a perspective view of a second substrate including connectors coupled to the receptacles of FIG. 7A according to an embodiment of the disclosure.

Referring to FIGS. 7A and 7B, the first substrate 420 may include a first receptacle 430 disposed to provide a first space 4201 in a manner of surrounding at least one first electrical element 425, and a second receptacle 430-1 disposed near the first receptacle 430 and disposed to provide a second space 4202 in a manner of surrounding at least one second electrical element 426. According to an embodiment, the second substrate 440 may include a first connector 450 having a corresponding shape to be connected to the first receptacle 430, and a second connector 450-1 having a corresponding shape to be connected to the second receptacle 430-1. According to an embodiment, the first connector 450 may include a third space 4501 at least partially facing the first space 4201. According to an embodiment, the second connector 450-1 may include a fourth space 4502 at least partially facing the second space 4202.

According to various embodiments, when the second substrate 440 is coupled to the first substrate 420, the first receptacle 430 and the first connector 450 are capable of maintaining the first space 4201 and the third space 4501 in a sealed state, thereby shielding the at least one first electrical element 425 disposed therein as well. In addition, since the second receptacle 430-1 and the second connector 450-1 are capable of maintaining the second space 4202 and the fourth space 4502 in a sealed state, it is also possible to shield the at least one second electrical element 426 disposed therein.

The connector shielding structure according to an embodiment of the disclosure is capable of individual shielding of the electrical elements 425 and 426 through the electrical coupling structures between the receptacles 430 and 430-1 and the connectors 450 and 450-1 having shielding spaces spaced apart from each other on one single substrate.

FIGS. 8A, 8B, 8C, 8D, and 8E are views each illustrating a configuration of a shielding structure obtained through coupling of a receptacle and a connector according to various embodiments of the disclosure.

Referring to FIGS. 8A to 8E, the first substrate 420 and the second substrate 440 are illustrated in different sizes for distinction, but the two substrates 420 and 440 are substantially the same in size, or the second substrate 440 may be larger than the first substrate 420. In addition, although receptacles and connectors are also illustrated in different sizes for distinction, they may have substantially the same size (e.g., width).

Figure 8A:
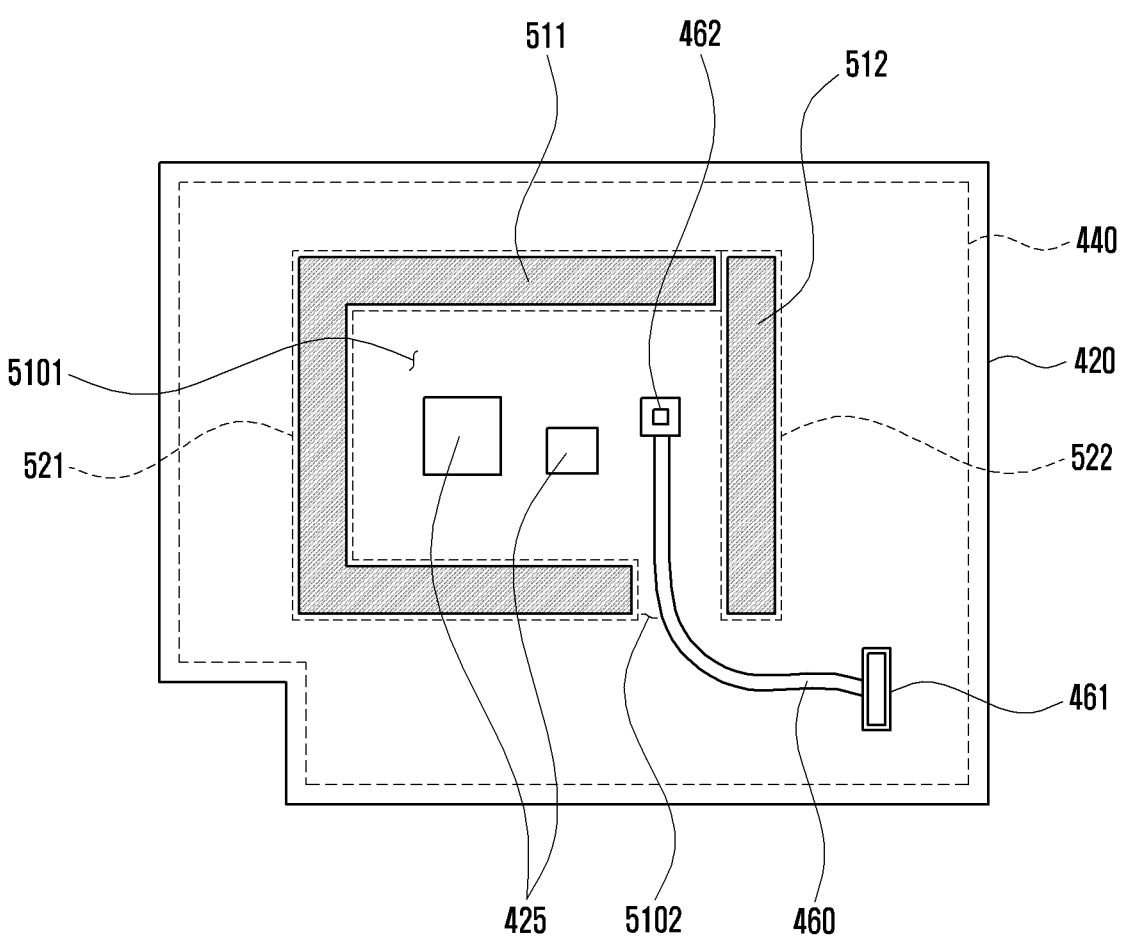
FIGS. 8A, 8B, 8C, 8D, and 8E are views each illustrating a configuration of a shielding structure obtained through coupling of a receptacle and a connector according to various embodiments of the disclosure.

Referring to FIG. 8A, an electronic device (e.g., the electronic device 400 of FIG. 4) may include a first substrate 420 and a second substrate 440 disposed to overlap the first substrate 420. According to an embodiment, the first substrate 420 and the second substrate 440 may be electrically connected to each other through coupling of two receptacles 511 and 512 and two connectors 521 and 522 corresponding thereto.

According to various embodiments, the first substrate 420 may include a first receptacle 511 and a second receptacle 512 arranged to define a first space 5101 that surrounds electrical elements 425. According to an embodiment, the second substrate 440 may include a first connector 521 connected to the first receptacle 511 and a second connector 522 connected to the second receptacle 512. According to an embodiment, the first space 5101 may include a portion 5102 partially opened from the outside through the arrangement of the first receptacle 511 and the second receptacle 512. In this case, the open portion 5102 may be used as a passage for an electrical connection member 460 (e.g., a conductive cable, a coaxial cable, or a flexible printed circuit board (FPCB)-type radio-frequency cable (FRC). For example, the electrical connection member 460 may include a cable extending to a specified length, wherein one end 461 of the electrical connection member may be disposed outside the first space 5101, and the other end 462 may be disposed in the first space 5101. In some embodiments, the receptacles and the connectors connected thereto may provide, to the first space, a passage path through which an electrical connection member pass.

Figure 8B:
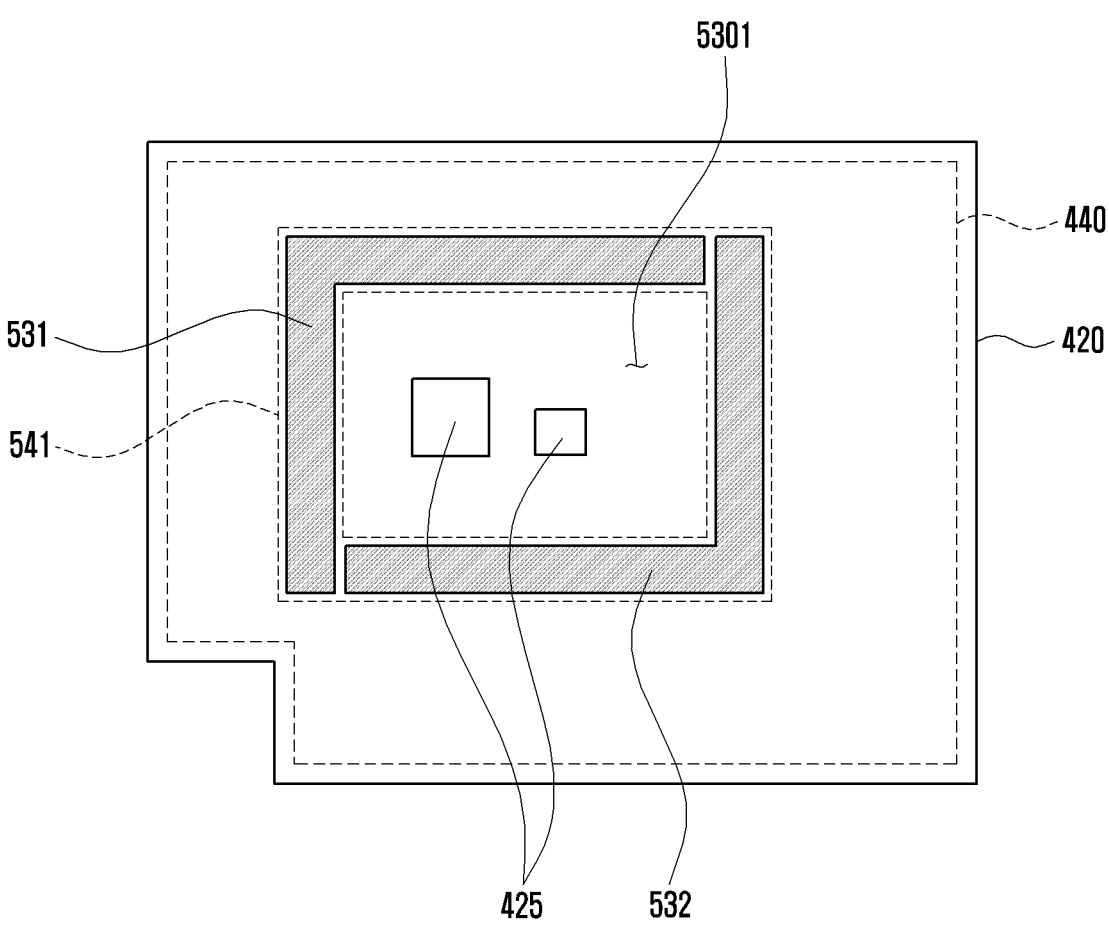

Referring to FIG. 8B, an electronic device (e.g., the electronic device 400 of FIG. 4) may include a first substrate 420 and a second substrate 440 disposed to overlap the first substrate 420. According to an embodiment, the first substrate 420 and the second substrate 440 may be electrically connected to each other through coupling of two receptacles 531 and 532 and a single connector 541 corresponding thereto.

According to various embodiments, the first substrate 420 may include a first receptacle 531 and a second receptacle 532 arranged to define a space 5301 that surrounds electrical elements 425 in a closed loop form. According to an embodiment, the second substrate 440 may include a connector 541 commonly connected to the first receptacle 531 and the second receptacle 532. In some embodiments, a coupling structure of three or more receptacles and at least one connector may be provided to provide a closed loop-shaped first space 5301. For example, the number of receptacles and the number of connectors may be different from each other.

Figure 8C:
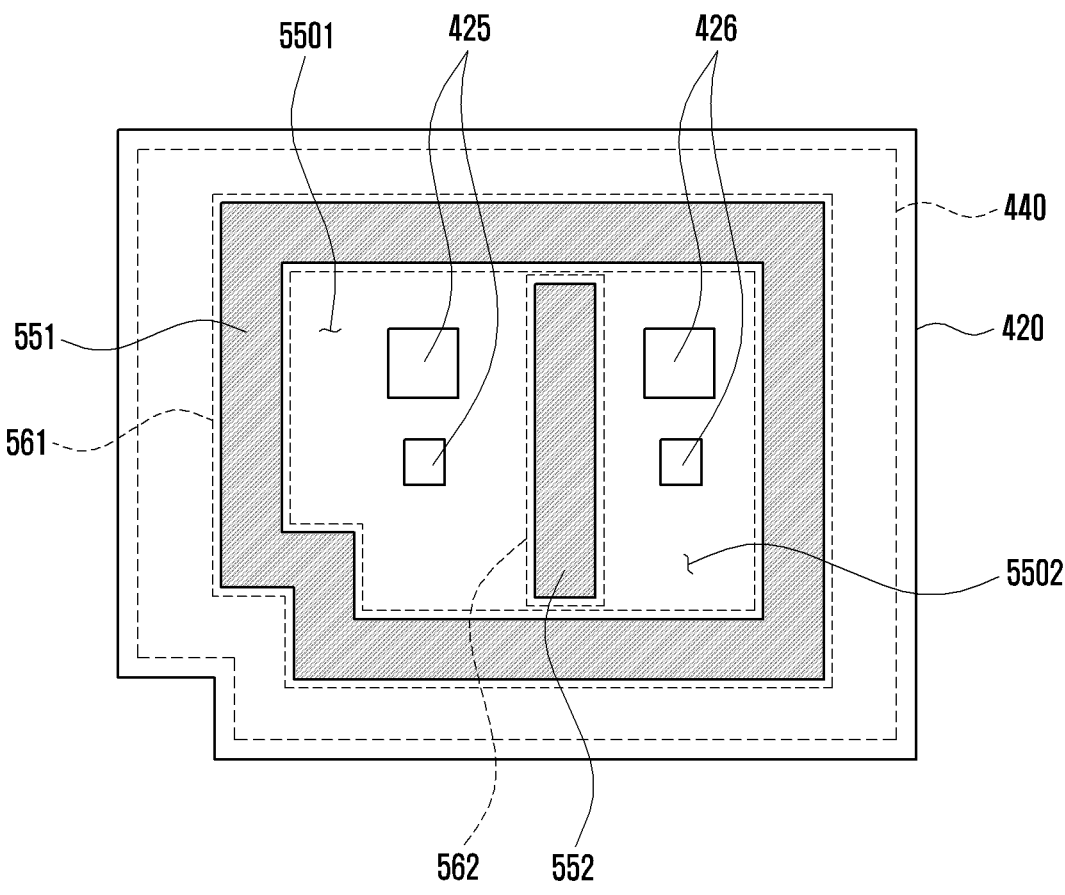

Referring to FIG. 8C, the first substrate 420 may include a closed loop-shaped first receptacle 551 and a second receptacle 552 disposed to cross at least a portion of the inner space of the first receptacle 551. According to an embodiment, the second substrate 440 may include a first connector 561 connected to the first receptacle 551 and a second connector 562 connected to the second receptacle 552. According to an embodiment, it may be possible to individually shield the electrical elements 425 and 426, which are disposed in the first space 5501 and the second space 5502 of the first receptacle 551 divided by the second receptacle 552, respectively.

Figure 8D:
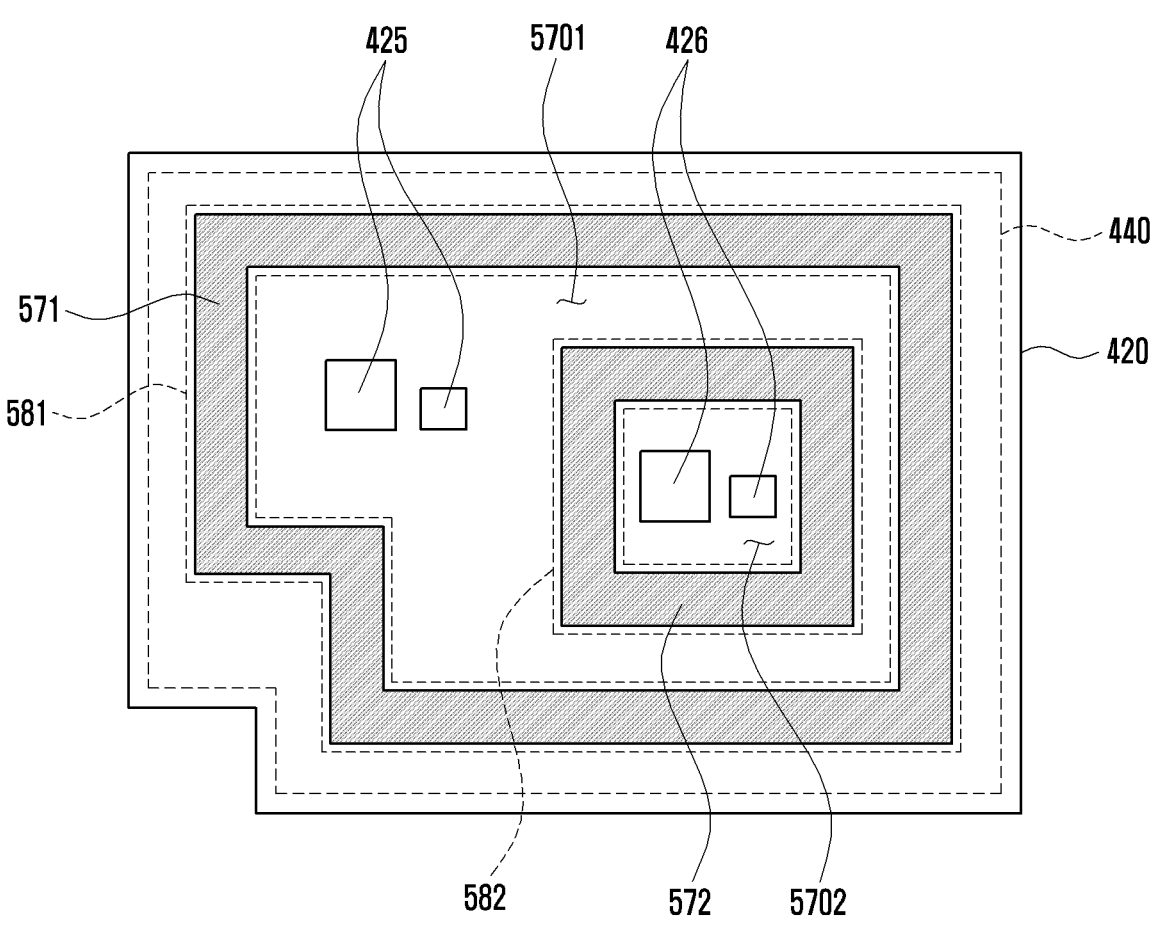

Referring to FIG. 8D, the first substrate 420 may include a first receptacle 571 having a closed loop-shaped first space 5701, and a second receptacle 572 disposed in the first space 5701 of the first receptacle 571 and having a closed loop-shaped second space 5702. According to an embodiment, the second substrate 440 may include a first connector 581 connected to the first receptacle 571 and a second connector 582 connected to the second receptacle 572. According to an embodiment, it may be possible to individually shield electrical elements 425 and 426, which are disposed in a first space 5701 defined by the first receptacle 571 and a second space 5702 defined by the second receptacle 572, respectively.

Figure 8E:
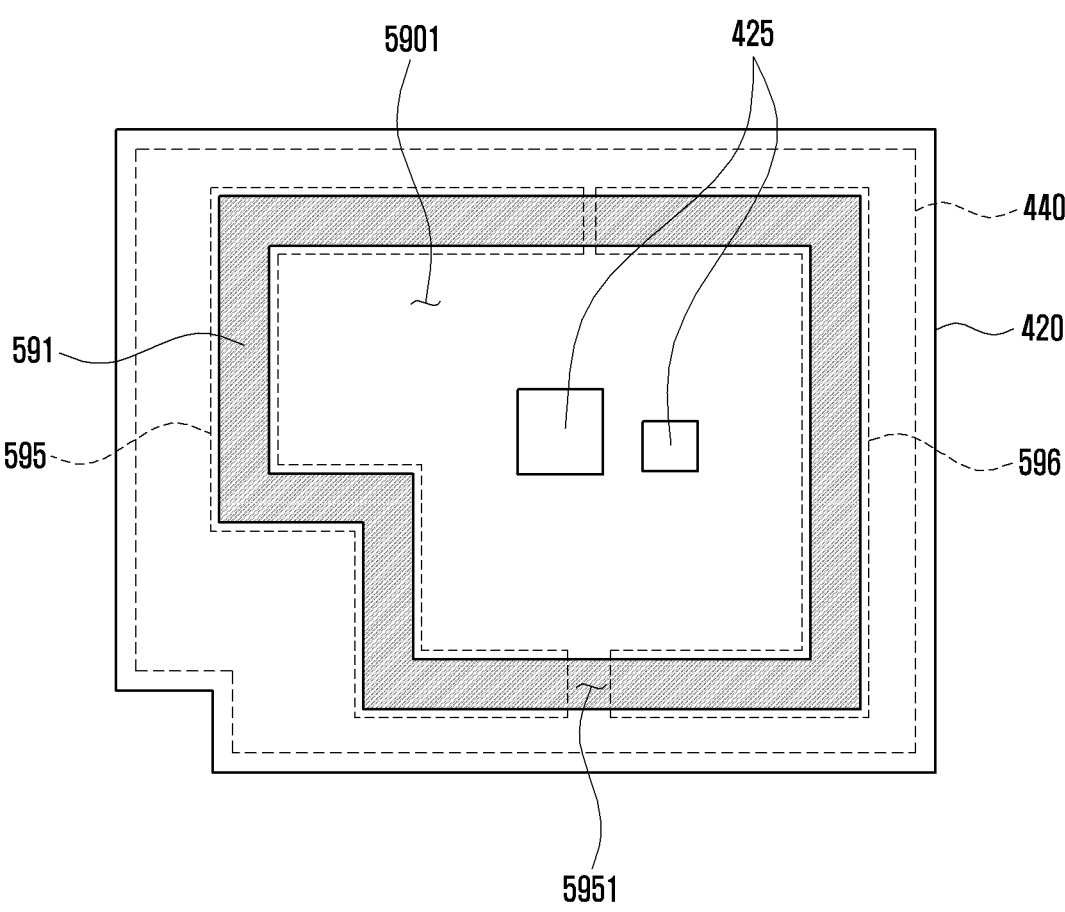

Referring to FIG. 8E, the first substrate 420 may include a receptacle 591 having a closed loop-shaped first space 5901. According to an embodiment, the second substrate 440 may include a first connector 595 connected to a partial area of the receptacle 591 and a second connector 596 connected to another partial area of the receptacle 591.

According to an embodiment, the first substrate 420 may provide a space 5951, which is at least partially separated by the first connector 595 and the second connector 596 within a range in which shielding performance for an electrical element 425 is not deteriorated. This separated space 5951 may be used as a passage path of the aforementioned electrical connection members (e.g., the electrical connection member 460 of FIG. 8A). In some embodiments, the first space 5901 may be defined by two or more receptacles on the first substrate 420, and two or more receptacles disposed on the first substrate 420 may be connected via a single connector disposed on the second substrate 440.

According to various embodiments, an electronic device (e.g., the electronic device 400 of FIG. 4) may include a housing (e.g., the housing 110 in FIG. 1), a first substrate (e.g., the first substrate 420 of FIG. 4) disposed in the inner space of the housing and including at least one electrical element (e.g., the electrical element 425 of FIG. 4), at least one receptacle (e.g., the receptacle 430 in FIG. 6B) disposed to at least partially surround the at least one electrical element in the first substrate, wherein the at least one receptacle includes at least one receptacle base (e.g., the receptacle base 431 in FIG. 6B) including a recess, wherein the at least one receptacle base includes a first side wall (e.g., the first side wall 432 of FIG. 6B) disposed adjacent to the at least one electrical element through the recess, a second side wall spaced outward from the first side wall (e.g., the second side wall 433 of FIG. 6B), and an island area (e.g., the island area 434 of FIG. 6B) protruding in the recess along a longitudinal direction, wherein the recess includes a first recess (e.g., the first recess 4301 in FIG. 6B) disposed between the island area and the first side wall and a second recess (e.g., the second recess 4302 in FIG. 6B) disposed between the island area and the second side wall, first multiple conductive terminals (e.g., the first multiple conductive terminals 4351 of FIG. 6B) arranged at a predetermined interval from at least a portion of the first side wall to at least a portion of the first recess, second multiple conductive terminals (e.g., the second multiple conductive terminals 4352 of FIG. 6B) arranged at a predetermined interval from at least a portion of the island area to at least a portion of the first recess, third multiple conductive terminals (e.g., the third multiple conductive terminals 4353 of FIG. 6B) arranged at a predetermined interval from at least a portion of the second side wall to at least a portion of the second recess, fourth multiple conductive terminals (e.g., the fourth multiple conductive terminals 4354 of FIG. 6B) arranged at a predetermined interval from at least a portion of the island area to at least a portion of the second recess, and at least one connector (e.g., the connector 450 in FIG. 6B) detachably coupled to the at least one receptacle, wherein the at least one connector includes at least one connector base (e.g., the connector base 451 in FIG. 6B) including an island seating portion (e.g., the island seating portion 454 of FIG. 6B) on which the island area is seated, a third side wall disposed to face the first recess (e.g., the third side wall 452 of FIG. 6B), and a fourth side wall (e.g., the fourth side wall 453 of FIG. 6B) disposed to face the second recess, first multiple connector terminals (e.g., the first multiple connector terminals 4551 of FIG. 6B) arranged on at least a portion of the third side wall and elastically coupled to the first multiple conductive terminals, second multiple connector terminals (e.g., the second multiple connector terminals 4552 of FIG. 6B) arranged on at least a portion of the third side wall and elastically coupled to the second multiple conductive terminals, third multiple connector terminals (e.g., the third multiple connector terminals

4553 of FIG. 6B) arranged on at least a portion of the fourth side wall and elastically coupled to the third multiple conductive terminals, and fourth multiple connector terminals (e.g., the fourth multiple connector terminals 4554 of FIG. 6B) arranged on at least a portion of the fourth side wall and elastically coupled to the fourth multiple conductive terminals. At least one multiple conductive terminal from among the first, the second, the third, and the fourth multiple conductive terminals may be electrically connected to a ground (e.g., the ground G of FIG. 6B) of the first substrate.

According to various embodiments, the at least one receptacle base may be disposed to surround the at least one electrical element in a closed loop form on the first substrate.

According to various embodiments, the third multiple conductive terminals may be electrically connected to the ground of the first substrate.

According to various embodiments, the at least one receptacle base may be disposed along an edge of the first substrate in a closed loop form when the first substrate is viewed from above.

According to various embodiments, the at least one receptacle base may have a size smaller than that of the first substrate when the first substrate is viewed from above.

According to various embodiments, the at least one electrical element may include two or more electrical elements arranged on the first substrate to be spaced apart from each other by a predetermined interval, and the at least one receptacle base may be arranged in a corresponding number individually surrounding the two or more electrical elements.

According to various embodiments, the at least one connector may be disposed on a second substrate, and when the at least one connector is coupled to the at least one receptacle, the first substrate and the second substrate may be electrically connected to each other.

According to various embodiments, among the first, the second, the third, and the fourth multiple connector terminals, at least one multiple connector terminal coupled to the at least one multiple conductive terminal electrically connected to the ground of the first substrate is electrically connected to a ground of the second substrate.

According to various embodiments, the second substrate may further include one or more other electrical elements, and the at least one connector base may be disposed to at least partially surround the one or more other electrical elements on the second substrate.

According to various embodiments, the at least one connector base may be disposed to surround the one or more other electrical elements in a closed loop form on the second substrate.

According to various embodiments, the at least one receptacle may define at least one space surrounding the at least one electrical element.

According to various embodiments, the at least one space may be defined with two or more receptacles.

According to various embodiments, the two or more receptacles may include a first receptacle defining a first space in a closed-loop form and a second receptacle disposed to cross the first space and dividing the first space into two spaces.

According to various embodiments, the two or more receptacles may include a first receptacle defining a first space in a closed-loop form and a second receptacle disposed in the first space and including a second space in a closed-loop form.

According to various embodiments, the at least one receptacle may include two or more receptacles, and the at least one connector may be arranged in a number corresponding to the two or more receptacles.

According to various embodiments, the at least one receptacle may include two or more receptacles, and the at least one connector may be arranged in a greater or smaller number than the two or more receptacles.

According to various embodiments, the at least one connector may be disposed to overlap the two or more receptacles when the first substrate is viewed from above.

According to various embodiments, the at least one receptacle may be disposed to include a passage path at least partially configured with two or more receptacles, and the passage path is configured to receive an electrical connection member.

According to various embodiments, the electrical connection member may include at least one of a flexible substrate (e.g., a flexible printed circuit board (FPCB), a coaxial cable, or an FPCB-type RF cable (FRC).

According to various embodiments, the at least one connector may be disposed to include a passage path at least partially configured with two or more connectors, and the passage path may be configured to receive an electrical connection member.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

a housing;

a first substrate disposed in an inner space of the housing and comprising at least one electrical element;

at least one receptacle disposed on the first substrate to at least partially surround the at least one electrical element, wherein the at least one receptacle comprises:

at least one receptacle base comprising a recess, wherein the at least one receptacle base comprises:

a first sidewall disposed adjacent to the at least one electrical element through the recess, a second side wall spaced outward from the first sidewall through the recess, and an island area protruding in the recess along a longitudinal direction, wherein the recess comprises:

a first recess disposed between the island area and the first s sidewall, and a second recess disposed between the island area and the second side wall, first multiple conductive terminals arranged at a predetermined interval from at least a portion of the first sidewall to at least a portion of the first recess, second multiple conductive terminals arranged at a predetermined interval from at least a portion of the island area to at least a portion of the first recess, third multiple conductive terminals arranged at a predetermined interval from at least a portion of the second side wall to at least a portion of the second recess, and fourth multiple conductive terminals arranged at a predetermined interval from at least a portion of the island area to at least a portion of the second recess; and at least one connector detachably coupled to the at least one receptacle, wherein the at least one connector comprises:

at least one connector base comprising an island seating portion on which the island area is seated, a third side wall disposed to face the first recess, and a fourth side wall disposed to face the second recess, first multiple connector terminals arranged on at least a portion of the third side wall and elastically coupled to the first multiple conductive terminals, second multiple connector terminals arranged on at least a portion of the third side wall and elastically coupled to the second multiple conductive terminals, third multiple connector terminals arranged on at least a portion of the fourth side wall and elastically coupled to the third multiple conductive terminals, and fourth multiple connector terminals arranged on at least a portion of the fourth side wall and elastically coupled to the fourth multiple conductive terminals, and wherein at least one multiple conductive terminal from among the first, the second, the third, and the fourth multiple conductive terminals is electrically connected to a ground of the first substrate, wherein, when the at least one connector is connected to the at least one receptacle, each of the first, second, third and fourth multiple conductive terminals is configured to have an individual electrical connection with respective individual first, second, third and fourth multiple connector terminals, wherein the first multiple connector terminals each forms an individual connection with the first multiple conductive terminals and the second multiple connector terminals each forms an individual connection with the second multiple conductive terminals within the first recess, and wherein the third multiple connector terminals each forms an individual connection with the third multiple conductive terminals and the fourth multiple connector terminals each forms an individual connection with the fourth multiple conductive terminals within the second recess separate from the first recess.

2. The electronic device of claim 1, wherein the at least one receptacle base is disposed to surround the at least one electrical element in a closed loop form on the first substrate.

3. The electronic device of claim 1, wherein the third multiple conductive terminals are electrically connected to the ground of the first substrate.

4. The electronic device of claim 1, wherein the at least one receptacle base is disposed along an edge of the first substrate in a closed loop form when the first substrate is viewed from above.

5. The electronic device of claim 1, wherein the at least one receptacle base has a size smaller than that of the first substrate when the first substrate is viewed from above.

6. The electronic device of claim 1, wherein the at least one connector is disposed on a second substrate, and wherein when the at least one connector is coupled to the at least one receptacle, the first substrate and the second substrate are electrically connected to each other.

7. The electronic device of claim 6, wherein, among the first, the second, the third, and the fourth multiple connector terminals, at least one multiple connector terminal coupled to the at least one multiple conductive terminal electrically connected to the ground of the first substrate is electrically connected to a ground of the second substrate.

8. The electronic device of claim 6, wherein the second substrate further comprises one or more other electrical elements, and wherein the at least one connector base is disposed to at least partially surround the one or more other electrical elements on the second substrate.

9. The electronic device of claim 8, wherein the at least one connector base is disposed to surround the one or more other electrical elements in a closed loop form on the second substrate.

10. The electronic device of claim 1, wherein the at least one receptacle defines at least one space surrounding the at least one electrical element.

11. The electronic device of claim 10, wherein the at least one space is defined with two or more receptacles.

12. The electronic device of claim 11, wherein the two or more receptacles comprise a first receptacle defining a first space in a closed-loop form and a second receptacle disposed to cross the first space and dividing the first space into two spaces.

13. The electronic device of claim 11, wherein the two or more receptacles comprise a first receptacle defining a first space in a closed-loop form and a second receptacle disposed in the first space and comprising a second space in a closed-loop form.

14. The electronic device of claim 1, wherein the at least one receptacle comprises two or more receptacles, and wherein the at least one connector is arranged in a number corresponding to the two or more receptacles.

15. The electronic device of claim 1, wherein the at least one receptacle includes two or more receptacles, and the at least one connector may be arranged in a greater or smaller number than the two or more receptacles.

16. The electronic device of claim 15, wherein the at least one connector is disposed to overlap the two or more receptacles when the first substrate is viewed from above.

17. The electronic device of claim 1, wherein the at least one receptacle is disposed to include a passage path at least partially configured with two or more receptacles, and wherein the passage path is configured to receive an electrical connection member.

18. The electronic device of claim 17, wherein the electrical connection member includes at least one of a flexible substrate, a coaxial cable, or a radio-frequency (RF) cable.

19. The electronic device of claim 1, wherein the at least one connector is disposed to include a passage path at least partially configured with two or more connectors, and wherein the passage path is configured to receive an electrical connection member.

\* \* \* \* \*